United States Patent [19]
Jennings

[11] 4,160,154
[45] Jul. 3, 1979

[54] HIGH SPEED MULTIPLE EVENT TIMER

[75] Inventor: Richard A. Jennings, Thousand Oaks, Calif.

[73] Assignee: Bunker Ramo Corporation, Oak Brook, Ill.

[21] Appl. No.: 757,827

[22] Filed: Jan. 10, 1977

[51] Int. Cl.$^2$ ............................................. H03K 21/08
[52] U.S. Cl. .......................... 235/92 EA; 235/92 TF; 235/92 DP; 235/92 CC; 235/92 R; 328/129
[58] Field of Search ............ 235/92 EA, 92 T, 92 TF, 235/92 CC, 92 PE, 92 GT, 92 CA, 92 DP; 328/129; 324/186, 78 D; 307/232

[56] References Cited
U.S. PATENT DOCUMENTS

| | | | |
|---|---|---|---|
| 3,063,631 | 11/1962 | Ray | 235/92 EA |
| 3,560,723 | 2/1971 | Kamachi | 235/92 EA |
| 3,602,699 | 8/1971 | Kamachi et al. | 235/92 EA |
| 3,649,815 | 3/1972 | Clifford | 235/92 GT |
| 3,805,031 | 4/1974 | Leibowitz et al. | 235/92 EA |
| 3,849,635 | 11/1974 | Freedman | 235/92 CC |
| 3,939,333 | 2/1976 | Keech | 235/92 EA |
| 3,982,108 | 9/1976 | Horsley | 235/92 EA |

*Primary Examiner*—Joseph M. Thesz
*Attorney, Agent, or Firm*—F. M. Arbuckle; A. M. Fernandez

[57] ABSTRACT

Apparatus for measuring the time of a plurality of successive events with respect to a reference time or event using a master circuit divided into two parts of N and M cascaded stages for counting clock pulses with an early carry propagated from the first part to the second part when the most significant stage of the first part undergoes a transition to a maximum value; and a slave circuit also comprised of two parts of N and M stages, a first part which follows the first part of the master circuit, except during the presence of an event pulse, and produces a normal carry when its most significant stage undergoes a transition from a maximum to a minimum value, and a second part which is a register loaded from the second part of the master circuit by a carry from the first part of the slave circuit. In one embodiment, the first part of the slave circuit is also a register loaded from the first part of the master circuit by clock pulses except during the presence of an event pulse. In a second embodiment, the first part of the slave circuit is comprised of a counter which counts clock pulses in unison with the master circuit, except during the presence of an event pulse. A comparator compares the first parts of the master and slave circuits to inhibit counting clock pulses in the slave circuit following an event pulse until the first part of the master circuit has cycled through to the state of the first part of the slave circuit. In some applications the second parts of the master and slave circuits may be omitted.

10 Claims, 4 Drawing Figures

HIGH SPEED MULTIPLE EVENT TIMER

BACKGROUND OF THE INVENTION

This invention relates to measuring the time intervals of one or more events with respect to a reference time or event.

It is often necessary to measure the time lapsed from a reference time or event to one or more following events using digital counting techniques. When a relatively slow clock rate may be utilized to measure time, i.e., when the clock period is long relative to the propagation time of the counter, the counter is easily read out and stored upon the occurrence of an event in an interval between clock pulses. To assure that the counter is read out while in a stable state, the read-out pulse generated by the event being timed is synchronized with the clock pulses.

As the period of the clock approaches the propagation time of the counter, a problem arises in having sufficient time to read out the counter after allowing for the maximum propagation time of carries through the counter. In other words, if the propagation time of the counter is too long relative to the period of the clock pulses, there may be very little or no stable period for reading out the counter between successive clock pulses. The problem then is to provide a way of reading out the counter without interrupting the operation of the counter.

SUMMARY OF THE INVENTION

In accordance with exemplary embodiments of the present invention, a master circuit is provided with a plurality of stages connected in cascade for counting clock pulses from a reference time or event to each of subsequent events. The master circuit is divided into two parts having N and M stages, respectively, where N and M are integers. In practice, N is selected to be large enough to permit a number of clock pulses to be counted for a total period sufficient to permit carries from the first part to propagate through the second part before another carry is propagated to the second part. The second part is coupled to the first by means for causing the second to respond to the transition of the most significant stage in the first prior to a maximum count in the first, whereby the second part of the master circuit is advanced in its normal count of clock pulses by a predetermined amount. A slave circuit is similarly divided into two parts of N and M stages with means coupling the first part of the slave circuit to the first part of the master circuit for causing the first part of the slave circuit to follow the first part of the master circuit in response to clock pulses, except during the presence of an event pulse and means for coupling the second part of the slave circuit to the second part of the master circuit for causing the second part of the slave circuit to be set to the state of the second part of the master circuit in response to a carry consisting of a transition of the first part of the slave circuit from a maximum to a minimum in the most significant stage thereof, whereby the second part of the slave circuit is retarded in count relative to the second part of the master circuit by the aforesaid predetermined amount. The result is the ability to read out the slave circuit after allowing time for carries through only the first part of the slave circuit.

In a first exemplary embodiment, the first part of the slave circuit is a register so coupled to the first part of the master circuit as to be set to the state of the first part of the master circuit in response to each clock pulse, and the means for causing the first part of the slave circuit to follow the first part of the master circuit, except during the presence of an event pulse, is comprised of means for inhibiting clock pulses from affecting the state of the slave circuit during the presence of a pulse indicating the occurrence of an event to be timed. The second part of the slave circuit is also a register so coupled to the second part of the master as to be set to the state of the first part of the master circuit in response to a carry from the first part of the slave circuit.

In a second exemplary embodiment, the first part of the slave circuit is comprised of a counter coupled to count the clock pulses in unison with the first part of the master circuit and the means for causing the first part of the slave circuit to follow the first part of the master circuit is comprised of means for comparing predetermined stages of the first part of the master circuit and the first part of the slave circuit to determine when there is a predetermined condition of comparison between stages compared, and means for inhibiting clock pulses from being counted by the first part of the slave circuit in response to an event pulse or in response to the comparing means during any period that the state of stages compared do not satisfy the predetermined condition. In that manner, the first part of the slave circuit is inhibited for the period of an event pulse, whereupon the content of the slave circuit is captured while the master counter continues to count clock pulses to measure total lapsed time from a reference time or event, and is inhibited for an additional period sufficient for the first part of the master circuit to count through to the state of the first part of the slave circuit. A third embodiment is a special case of the second embodiment in which only the first parts of the master and slave circuits are employed.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
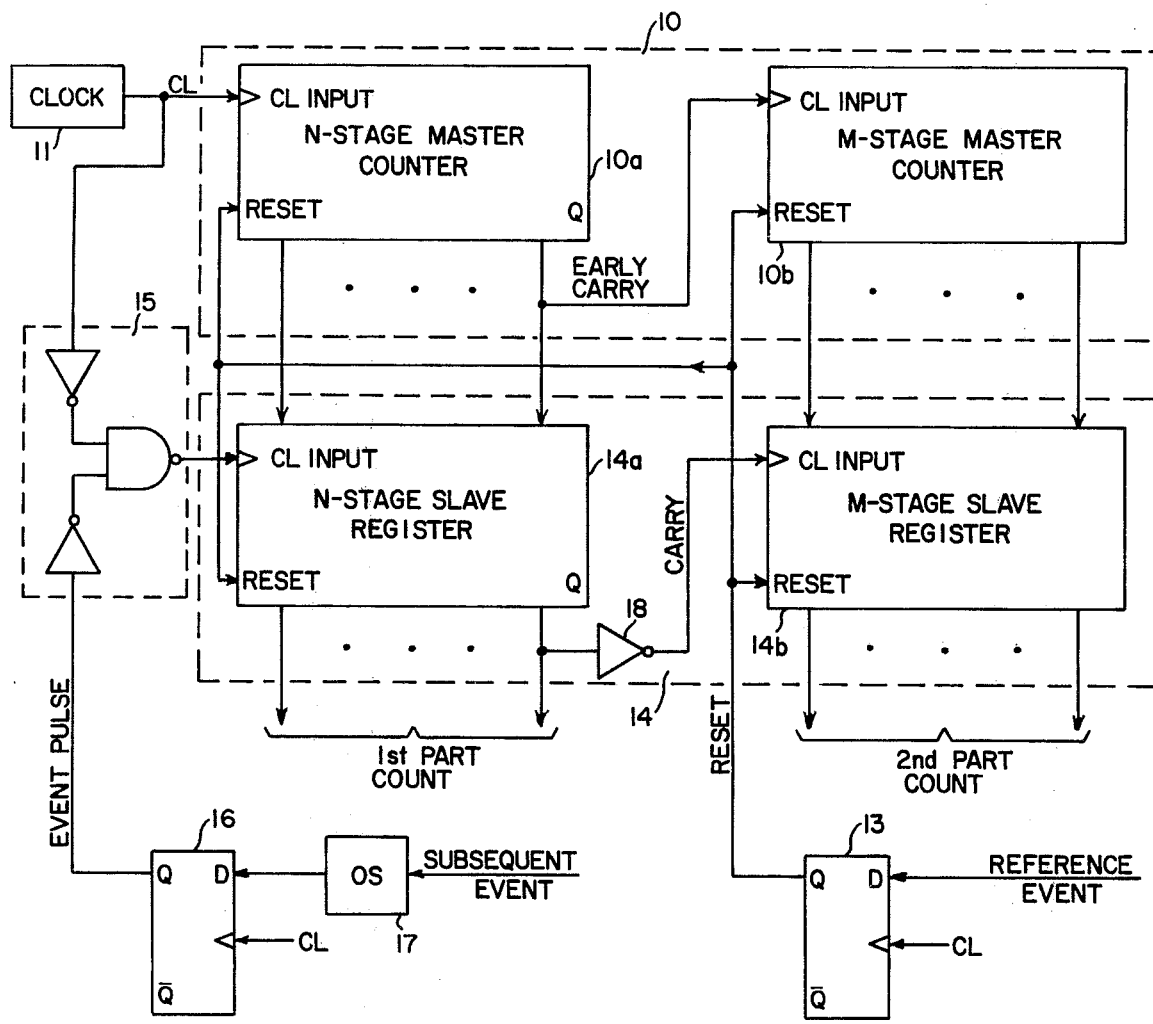
FIG. 1 illustrates a first embodiment of the invention.

Referring now to a first embodiment illustrated in FIG. 1, a master circuit 10 separated into two parts 10a and 10b is connected to count clock pulses from a stable source 11 in order to measure the lapsed time from a single reference event to two or more subsequent events. The reference event is marked by a pulse synchronized through an edge-sensitive D-type flip-flop 13. The result is a pulse which resets the master circuit 10 and a slave circuit 14 to initiate the measurement of lapsed time to two or more subsequent events.

The slave circuits 14 is also separated into two parts 14a and 14b, and in this first embodiment both parts are implemented as registers. The first part 14a is set from parallel outputs of the master counter on the leading edge of each clock pulse via an inhibit gate 15. The second part 14b of the slave circuit is set from parallel outputs of the master circuit from the carry of the first part 14a. In that manner the slave circuit tracks the master circuit, except during the presence of a subsequent event pulse which is synchronized by an edge-sensitive D-type flip-flop 16 and effectively stretched by a one-shot 17. The duration of an event pulse, thus synchronized and latched, is selected to be sufficient for any carries in the slave circuit to be propagated through the first part 14a and for the contents of the slave circuit to be read out. Typically, read-out would be accomplished at the trailing edge of the synchronized and latched subsequent event pulse. In the meantime, clock pulses advance the master circuit. The content of the master circuit at the time of a subsequent event is thus captured in the slave circuit and stored for reading while the master circuit continues to count undisturbed.

Figure 2:
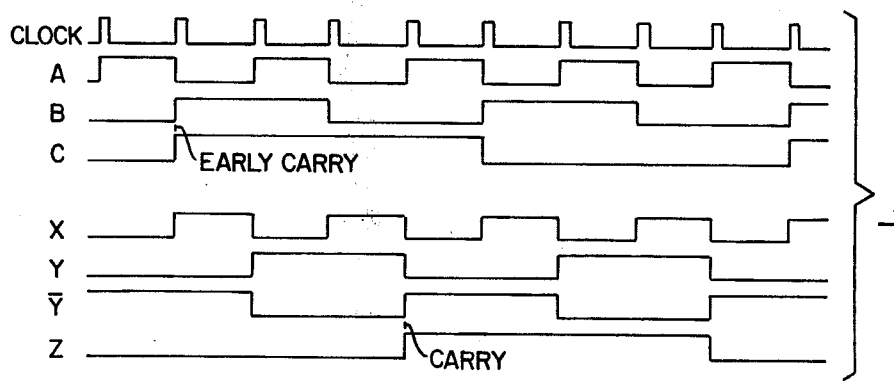
FIG. 2 illustrates waveforms useful in understanding the operation of the first embodiment.

The object of this two-part arrangement for the master and slave circuits is to provide sufficient time to sample and store the content of the master circuit 10 prior to incrementing the master circuit, i.e., before the next clock pulse, without danger of the most significant stages (the second part 10b) changing during the sampling. To accomplish that, the second part 10b of the master circuit is incremented as though a carry had been propagated when the most significant stage of the first part 10a of the master circuit is set. The master circuit is thus a counter having N+M stages in which the Nth stage transmits an early carry when it is set. For example, if each stage is a binary positive-edge counting stage, the first part of the master circuit transmits a carry after counting $2^{(N-1)}$ clock pulses. the second part 10b of the counter is thus incremented when only $2^{(N-1)}$ clock pulses have been counted, which is $2^{(N-1)}$ clock pulses early. FIG. 2 illustrates this operation for the simple binary counter case of N=2 and M=1+K, where K is any whole integer. Waveforms A and B illustrate the states (Q outputs) of the two stages in the first part 10a of the master circuit, and waveform C illustrates the state of the first stage of the second part 10b. Waveforms X, Y and Z illustrate the states of corresponding stages of the slave circuit, and waveform $\overline{Y}$ is the complement of waveform Y. During each clock pulse, the content of the first part 10a is transferred in parallel into the first part 14a of the slave circuit. Since that occurs on the leading edge of each clock pulse, the count in the slave circuit will lag by a count of one clock pulse.

The inhibit gate 15 is shown to be two inverters connected to the input terminals a NAND gate. As such, the inhibit gate may be implemented with inverters coupling the clock and $\overline{Q}$ output of the flip-flop 16 to a conventional AND gate. Alternatively, the Q output of the flip-flop may be connected directly to the NAND gate while the clock is coupled to the NAND gate through an inverter. Still other possibilities will occur to those skilled in the art for implementing the functions described.

The second part 14b of the slave circuit, also implemented as a register, copies the output of the second part 10b of the master circuit in response to a carry from the first part of the slave circuit, i.e., on the leading edge of the complement ($\overline{Y}$) of the output of the first part 14b of the slave circuit. That is shown by the clock input of the second part of the slave circuit being connected to the Q output of the first part of the slave circuit through an inverter 18, although in practice, the complementary output ($\overline{Q}$) of the most significant bit of the first part could be connected directly to the clock input of the second part if such an output were available. The result is a count output from the slave circuit accurate to within one clock pulse. In other words, the output of the slave circuit is always just one clock pulse behind the actual count in the master circuit. By transmitting an early carry to the second part of the master circuit and setting the second part of the slave circuit from the second part of the master circuit only upon an actual carry out of the first part of the slave circuit, there is a total delay of $2^{(N-1)}$ clock pulses from the time the second part of the master circuit is incremented until the second part of the slave circuit is loaded from the master counter. A judicious selection of the integer N provides sufficient time for any carry to propagate through the second part of the master circuit before it is sampled, even for stages implemented with slower, more dense and less expensive circuits, and for any number selected for the integer K.

To summarize the first embodiment disclosed in FIG. 1, a reference event initializes the master circuit 10 via flip-flop 13 and optionally initializes the slave circuit 14, Subsequent clocks simultaneously advance the master and slave circuits. After $2^{(N-1)}$ clock pulses, an early carry is propagated to the second part of the master circuit. After $2^N+1$ clock pulses (+1 because the slave circuit lags the master circuit by one clock pulse), a carry is transmitted in the slave circuit to copy the content of the second part of the master circuit into the second part of the slave circuit. At any time that a synchronized and latched event pulse occurs, the gate 15 is inhibited to effectively freeze the state of the slave circuit, except for any carry propagated from the first part to the second part of the slave circuit. The one-shot 17 latches any subsequent event pulse for a period sufficient to assure that a carry into the second part of the slave circuit will cause the content of the second part of the master circuit to be transferred to the second part of the slave circuit. At the end of the latched event pulse, the content of the slave circuit is read out. Because of the interconnection of the slave circuit stages, the slave circuit will always be only one clock pulse less than the correct value when stopped for reading out, even when operation of the second parts of the circuits is slow.

Figure 3:
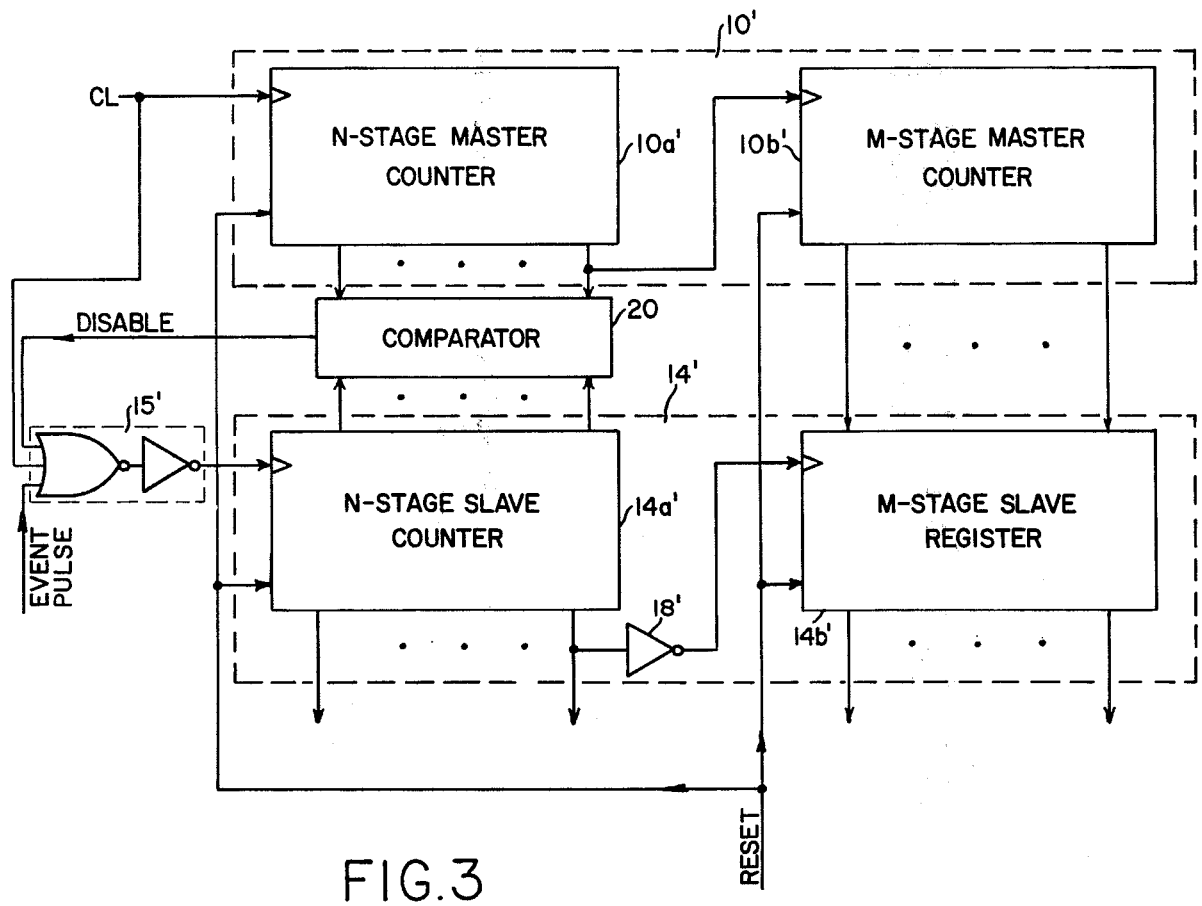
FIG. 3 illustrates a second embodiment of the invention.
Figure 4:
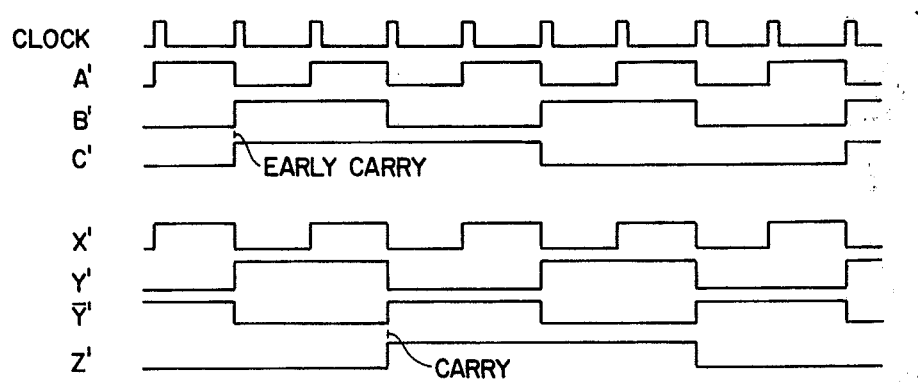
FIG. 4 illustrates waveforms useful in understanding the operation of the second embodiment.

Referring now to FIG. 3, in which elements corresponding to similar elements in the first embodiment are identified by primed reference numerals, the first part 14a' of the slave circuit 14' is implemented as a counter having N stages to operate in parallel with the first part 10'a of the master circuit 10'. Once initialized, the operation of the slave circuit is the same as in the first embodiment, except that the first part 14a' is itself counting clock pulses so that the count read out will be equal the count in the master counter, and not one less as in the case of the first embodiment. After the first and each subsequent latched and synchronized event pulse, gate 15' continues to be inhibited by the output of a comparator 20 until the master circuit has counted not more than (and possibly less as will be described hereinafter) $2^N$ pulses while the gate 15' is inhibited. During that time of $2^N$ clock pulses, the state of the slave counter is stable from at least the end of the latched and synchronized subsequent event pulse. Consequently, there is ample time to read out the count after each event. Once the first part of the master circuit has counted $2^N$ clock pulses, the gate 15 is no longer inhibited and since the master and slave circuits are equal, both counters resume counting in unison. FIG. 4 illustrates the operation of the second embodiment where the waveforms A', B' and C' of the first part are the same as the waveforms A, B and C in FIG. 2. Waveforms X', Y' and Z' in FIG. 4 differ from waveforms X, Y and Z of FIG. 2 only in that they are in phase with waveforms A', B' and C' instead of lagging in phase by one clock pulse period.

The inhibit gate 15' is shown as a NOR gate with an invertor which is equivalent to a gate with inverting input terminals, but as in the case of the inhibit gate 15 of FIG. 1, other possibilities for implementing the functions described with reference to FIG. 3. As in the case of the first embodiment, the first part of the slave circuit is assumed to be edge-sensitive to positive pulses, i.e., assumed to trigger on the leading edge of a positive clock pulse. Since that is not a requirement for practicing the invention, other implementations of the inhibit gate would be possible, and perhaps required, but the function of the gate remains the same.

The foregoing description of the operation of the second embodiment illustrated in FIG. 3 implies that the comparator 20 compares all of the stages of the first part of the master circuit with all of the stages of the first part of the slave circuit. Where the first part involves only two stages, that would be reasonable, but where N is a large integer, such as 5 or 6, less than all bits may be compared to inhibit the gate 15' while the master circuit continues to count. The master circuit will eventually reach the count at which the slave circuit is resting. The slave circuit is then enabled to advance on subsequent clock pulses in synchronism with the master circuit. To accomplish that, the comparator may be implemented in many different ways. Assuming a binary counter having n stages, the simplest implementation would be with an AND gate connected for any one of the following Boolean functions:

Disable = $R_{(n-1)} \cdot (\overline{S_{(n-1)}})$

Disable = $(\overline{R_{(n-1)}}) \cdot (S_{(n-1)})$

Disable = $R_{(n-1)} \oplus S_{(n-1)}$

Where $R_{(n-1)}$ is the master counter bit $2^{(n-1)}$ and $S_{(n-1)}$ is the slave counter bit $2^{(n-1)}$. In the case of a 2-bit counter, application of these Boolean functions is obvious. In fact, by inspection of FIG. 4, it may be seen that the comparator can be implemented by any one of the following Boolean functions Disable = $B \cdot \overline{Y}$ Disable = $\overline{B} \cdot Y$ Disable = $B \oplus Y$ Disable = $A \oplus Y + B \oplus X$ For larger counters more complex functions can be generated to cause synchronization to take place in fewer clock cycles. In general, any function which will be satisfied during at least one clock cycle out of $2^n$ clock cycles when the master and slave count are unequal regardless of their relative values, and which is false when the counts are equal, will eventually cause synchronization. Faster synchronization will occur if more bits of the counters are employed in generating the disable function, but the generation of the function must be completed in time to disable the slave counter clock.

The implementation of the first part of the master and slave circuits with a comparator according to the second embodiment may be used to advantage without the second part of the master and slave circuits as a special case. In either the general or special case of the second embodiment, and in the case of the first embodiment, the invention has the advantage that a given speed of logic may be utilized for repetitive time measurement at as high a clock frequency as single-interval (start/stop) measurement with comparable resolution and accuracy. The invention may be utilized to save power (by use of slower, low power logic), to save cost and layout complexity (by use of slower, less expensive logic with slower rise times and greater noise immunity), or to achieve state-of-the-art speeds utilizing the fastest available logic at higher speeds. The invention has no advantage in ordinary single-interval measurement applications common in laboratories. The usefulness of measuring multiple time intervals relative to a single reference may become more desirable in applications where counters are interfaced to real-time computers, microprocessors or calculators which provide memory necessary to store multiple readings faster than they could be entered from a conventional multiple event counter. Measurement of several events relative to a single start event conveys more information than single-interval measurements, such as both phase and frequency for a train of pulses.

Although particular embodiments of the invention have been described and illustrated herein, it is recognized that modifications and variations may readily occur to those skilled in the art. For example, the stages of the counters need not be binary stages. They could be decimal stages, each stage having four binary stages interconnected to count in one of a number of different weighted code modes, such as one of the following codes.

| | WEIGHTED DECIMAL CODES | | | |
|---|---|---|---|---|
| | 8 4 2 1 | 6 3 1 1 | 5 2 1 1 | 3 3 2 1 |
| 0 | 0 0 0 0 | 0 0 0 0 | 0 0 0 0 | 0 0 0 0 |
| 1 | 0 0 0 1 | 0 0 0 1 | 0 0 0 1 | 0 0 0 1 |
| 2 | 0 0 1 0 | 0 0 1 1 | 0 1 0 0 | 0 0 1 0 |
| 3 | 0 0 1 1 | 0 1 0 0 | 0 1 1 0 | 0 0 1 1 |
| 4 | 0 1 0 0 | 0 1 0 1 | 0 1 1 1 | 0 1 0 1 |
| 5 | 0 1 0 1 | 0 1 1 1 | 1 0 0 0 | 1 0 1 0 |
| 6 | 0 1 1 0 | 1 0 0 0 | 1 0 0 1 | 1 1 0 0 |
| 7 | 0 1 1 1 | 1 0 0 1 | 1 0 1 1 | 1 1 0 1 |
| 8 | 1 0 0 0 | 1 0 1 1 | 1 1 1 0 | 1 1 1 0 |
| 9 | 1 0 0 1 | 1 1 0 0 | 1 1 1 1 | 1 1 1 1 |

Alternatively, they could be decimal stages, each having four or five binary stages, interconnected to count in one of a number of different nonweighted code modes, such as one of the following codes.

| | NONWEIGHTED DECIMAL CODES | |
|---|---|---|
| | "Excess Three" | "Two-Out-of-Five" |
| 0 | 0 0 1 1 | 0 0 0 1 1 |
| 1 | 0 1 0 0 | 0 0 1 0 1 |
| 2 | 0 1 0 1 | 0 0 1 1 0 |
| 3 | 0 1 1 0 | 0 1 0 0 1 |
| 4 | 0 1 1 1 | 0 1 0 1 0 |
| 5 | 1 0 0 0 | 0 1 1 0 0 |
| 6 | 1 0 0 1 | 1 0 0 0 1 |
| 7 | 1 0 1 0 | 1 0 0 1 0 |
| 8 | 1 0 1 1 | 1 0 1 0 0 |
| 9 | 1 1 0 0 | 1 1 0 0 0 |

In the straight binary code mode or in any of these different weighted code modes, the carry from the first part to the second part of the master or slave circuit can be generated by sampling and decoding a number of stages rather than sampling only the most significant bit of the first part of the circuit. This sampling and decoding technique is particularly useful for count sequences in which the most significant bit of the first part is not symmetrical, as in the 8-4-2-1 code, or when the second part of the slave circuit has unequal data set-up and hold times. It is therefore intended that the claims be interpreted to cover such modifications and variations.

The embodiments of the invention in which an exclusive property or privilege is claimed are deifned as follows:

1. Apparatus for measuring the time of a plurality of successive event pulses with respect to a reference time or event by counting clock pulses, where each event pulse is of sufficient duration to allow for propagation of any carries through at least N counting stages and for thereafter reading out the count in parallel, said apparatus comprising,
    a source of said clock pulses,
    a master circuit divided into first and second parts of N and M stages, respectively, for counting said clock pulses, where N and M are integers,
    means for causing said second part of said master circuit to respond to a transition of the most significant stage of said first part of said master circuit to a maximum value, whereby the second part is advanced in its normal count of clock pulses by a predetermined amount,
    a slave circuit divided into first and second parts of N and M stages,
    means for causing said first part of said slave circuit to follow said first part of said master circuit, except during the presence of an event pulse,
    means for producing a normal carry from said first part of said slave circuit in response to a transition of the most significant stage thereof from a maximum value to a minimum value, and
    means responsive to said normal carry for causing said second part of said slave circuit to be set to the state of the second part of said master circuit, whereby the output of said first and second parts of said slave circuit provide a running count of clock pulses since said reference time or event, and the running count present at the time of each successive event pulse is captured during the presence of the event pulse.

2. Apparatus as defined in claim 1 wherein each of said first and second parts of said slave circuit is comprised of a register set to the state of the corresponding part of said master circuit in response to each clock pulse applied to the first part and a carry from the first part of said slave circuit applied to the second part of said slave circuit, and said means for causing said first part of said slave circuit to follow said first part of said master circuit, except during the presence of an event pulse, is comprised of means responsive to each event pulse for inhibiting clock pulses from being applied to said first part of said slave circuit.

3. Apparatus as defined in claim 1 wherein said first part of said slave circuit is comprised of a counter coupled to count said clock pulses in unison with the first part of said master circuit, and said second part of said slave circuit is comprised of a register set to the state of the second part of said master circuit in response to a carry from the first part of said slave circuit to the second part of said slave circuit, and wherein said means for causing said first part of said slave circuit to follow said first part of said master circuit, except during the presence of an event pulse, is comprised of,
    means for comparing predetermined stages of said first part of said master circuit with said first part of said slave circuit to determine when there is a predetermined condition of comparision between stages compared, and
    means for inhibiting clock pulses from being applied to said first part of said slave circuit in response to an event pulse or in response to said comparing means during any period that the states of stages compared do not satisfy said predetermined condition.

4. Apparatus for measuring the time of a plurality of successive event pulses with respect to a reference time or event, where each event pulse is of sufficient duration to allow for propagation of any carries through at least N counting stages and for thereafter reading out the count in parallel, said apparatus comprising
    a source of clock pulses,
    a first counter of N + M stages for counting said clock pulses, wherein the most significant stage of the N stages generates early carries to said M stages,
    a second counter of N stages for counting said clock pulses in unison with said first counter, and a register of M stages for storing in parallel the contents of said M stages of said first counter in response to a normal carry of said N stages in said second counter,
    means for comparing the states of selected stages of said first counter with states of corresponding stages of said second counter to determine when said second counter is at the same state of said first counter, and
    means responsive to said event pulses and to said comparing means for inhibiting said second counter from counting said clock pulses during the presence of an event pulse or when said second counter is not at the same state of said first counter following the occurrence of an event pulse, whereby following any period during which said second counter is inhibited from counting said clock pulses, said second counter is inhibited until said selected stages of said first counter compares with said second counter.

5. Apparatus for measuring the time of a plurality of successive events with respect to a reference time or event comprising
    a source of clock pulses, and means for synchronizing event pulses with said clock pulses,
    a master circuit divided into two parts of N and M cascaded stages for counting said clock pulses with an early carry propagated from the first part to the second part when the most significant stage of the first part undergoes a transition to a maximum value; and
    a slave circuit also comprised of two parts of N and M stages, a first part which follows the first part of said master circuit, except during the presence of a synchronized event pulse, and produces a normal carry when its most significant stage undergoes a transition from a maximum to a minimum value; and a second part which is a register loaded from the second part of said master circuit by a carry from the first part of said slave circuit.

6. Apparatus as defined in claim 5 wherein the first part of said slave circuit is also a register loaded from the first part of said master circuit by clock pulses except during the presence of a synchronized event pulse.

7. Apparatus as defined in claim 5 wherein the first part of said slave circuit is comprised of a counter which counts clock pulses in unison with the first part of said master circuit, except during the presence of a synchronized event pulse, and a means for comparing the first parts of the master and slave circuits to inhibit counting clock pulses in the slave circuit following an event pulse until the first part of said master circuit has cycled through to the state of the first part of said slave circuit.

8. In combination,
a source of clock pulses,
a master circuit comprising a plurality of stages connected in cascade for counting clock pulses from a reference event pulse to each of subsequent events pulses, said master circuit being divided into two parts having N and M stages, respectively, where N and M are integers, and the stages of each of said two parts are connected in cascade, with the second part coupled to the first by means for causing the second part to respond to the transition of the most significant stage in the first part prior to a maximum count in the first part, whereby the second part of said master circuit is advanced in its normal count of clock pulses by a predetermined amount,
a slave circuit similarly divided into two parts of N and M stages with means coupling the first part of said slave circuit to the first part of said master circuit for causing the first part of said slave circuit to follow the first part of said master circuit in response to said clock pulses, except during the presence of an event pulse, means for coupling the second part of said slave circuit to the second part of said master circuit for causing the second part of said slave circuit to be set to the state of the second part of said master circuit in response to a carry consisting of a transition of the first part of said slave circuit from a maximum to a minimum in the most significant stage thereof, whereby the second part of said slave circuit is retarded in count relative to the second part of said master circuit by the aforesaid predetermined amount, and means for resetting said master circuit and said slave circuit in response to a reference event pulse.

9. The combination of claim 8 wherein the first part of said slave circuit is a register so coupled to the first part of said master circuit as to be set to the state of the first part of said master circuit in response to each clock pulse, and wherein said means for causing the first part of said slave circuit to follow the first part of said master circuit, except during the presence of an event pulse, is comprised of means for inhibiting clock pulses from affecting the state of said slave circuit during the presence of an event pulse.

10. The combination of claim 9 wherein the first part of said slave circuit is comprised of a counter coupled to count said clock pulses in unison with the first part of said master circuit and said means for causing the first part of the slave circuit to follow the first part of the master circuit is comprised of means for comparing predetermined stages of the first part of said master circuit and the first part of the slave circuit to determine when there is a predetermined condition of comparison between stages compared, and means for inhibiting clock pulses from being counted by the first part of said slave circuit in response to an event pulse or in response to the comparing means during any period that the state of stages compared do not satisfy said predetermined condition of comparison.

* * * * *